United States Patent
Sugaya et al.

(10) Patent No.: US 9,923,543 B2
(45) Date of Patent: Mar. 20, 2018

(54) RADIO FREQUENCY MODULE

(71) Applicant: Murata Manufacturing Co., Ltd., Nagaokakyo-shi, Kyoto-fu (JP)

(72) Inventors: Yukiteru Sugaya, Nagaokakyo (JP); Shinya Mizoguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/359,754

(22) Filed: Nov. 23, 2016

(65) Prior Publication Data

US 2017/0077896 A1    Mar. 16, 2017

Related U.S. Application Data

(63) Continuation of application No. PCT/JP2016/053303, filed on Feb. 4, 2016.

(30) Foreign Application Priority Data

Feb. 25, 2015    (JP) .................. 2015-034723

(51) Int. Cl.
*H03H 7/38* (2006.01)
*H03H 7/46* (2006.01)
(Continued)

(52) U.S. Cl.
CPC .......... *H03H 7/463* (2013.01); *H03H 7/0138* (2013.01); *H03H 7/09* (2013.01);
(Continued)

(58) Field of Classification Search
CPC ........ H03H 7/463; H03H 7/0138; H03H 7/09; H03H 7/38; H03H 9/0542; H03H 9/0566;
(Continued)

(56) References Cited

U.S. PATENT DOCUMENTS

| | | |
|---|---|---|
| 2012/0119847 A1 | 5/2012 | Iwaki et al. |
| 2015/0042417 A1 | 2/2015 | Onodera et al. |
| 2015/0137909 A1 | 5/2015 | Okuda et al. |

FOREIGN PATENT DOCUMENTS

| | | |
|---|---|---|
| JP | 2012-109818 A | 6/2012 |
| JP | 2015-033080 A | 2/2015 |
| WO | 2014/034373 A1 | 3/2014 |

OTHER PUBLICATIONS

Official Communication issued in corresponding International Application PCT/JP2016/053303, dated Apr. 26, 2016.

*Primary Examiner* — Robert J Pascal
*Assistant Examiner* — Kimberly Glenn
(74) *Attorney, Agent, or Firm* — Keating & Bennett, LLP

(57) ABSTRACT

A radio frequency module includes a transmission terminal, a transmission filter connected to the transmission terminal, a common terminal, a reception filter which is connected to the common terminal, a reception terminal, a branch point to which the common terminal, the transmission filter, and the reception filter are connected, a transmission path connecting the transmission terminal and the branch point, a reception path connecting the reception terminal and the branch point, a common path connecting the common terminal and the branch point, a matching circuit connected to the common path, and an inductor circuit that includes a first inductor that defines a propagation path through electromagnetic coupling to at least one of the transmission path, the common path, the matching circuit, and the reception path, and a second inductor that is positioned so as not to be electromagnetically coupled to the transmission path, the common path, the matching circuit, or the reception path.

18 Claims, 8 Drawing Sheets

(51) Int. Cl.
*H03H 9/64* (2006.01)
*H04B 1/52* (2015.01)
*H03H 7/01* (2006.01)
*H03H 9/54* (2006.01)
*H03H 9/70* (2006.01)
*H03H 9/72* (2006.01)
*H03H 7/09* (2006.01)
*H03H 9/05* (2006.01)

(52) U.S. Cl.
CPC ............ *H03H 7/38* (2013.01); *H03H 9/0542* (2013.01); *H03H 9/0566* (2013.01); *H03H 9/54* (2013.01); *H03H 9/64* (2013.01); *H03H 9/706* (2013.01); *H03H 9/725* (2013.01); *H04B 1/52* (2013.01)

(58) Field of Classification Search
CPC H03H 9/54; H03H 9/64; H03H 9/706; H03H 9/725; H04B 1/52
See application file for complete search history.

RADIO FREQUENCY MODULE

CROSS REFERENCE TO RELATED APPLICATIONS

This application claims the benefit of priority to Japanese Patent Application No. 2015-034723 filed Feb. 25, 2015 and is a Continuation Application of PCT Application No. PCT/JP2016/053303 filed on Feb. 4, 2016. The entire contents of each application are hereby incorporated herein by reference.

BACKGROUND OF THE INVENTION

1. Field of the Invention

The present invention relates to a radio frequency module that demultiplexes a transmission signal and a reception signal.

2. Description of the Related Art

A radio frequency module including a filter circuit has been previously provided. For example, a filter circuit 500 illustrated in FIG. 12 is mounted to a radio frequency module (see, e.g., Japanese Unexamined Patent Application Publication No. 2012-109818 (Paragraphs 0019 to 0023, FIG. 1, Abstract, etc.)). The filter circuit 500 includes a filter unit 503 connected between an input terminal 501 and an output terminal 502, and a path 504 connected in parallel to the filter unit 503. Thus, a signal path through which an RF (Radio Frequency) signal input to the input terminal 501 passes is branched into a path, which includes the filter unit 503, and the path 504. Therefore, when the RF signal is input to the input terminal 501, a first signal 505 passes through the filter unit 503, and a second signal 506 passes through the path 504. The first signal 505 having passed through the filter unit 503 and the second signal 506 having passed through the path 504 are combined, and a resultant RF signal is output from the output terminal 502.

The filter unit 503 includes a bandpass filter in which a predetermined pass band is set, and it allows the RF signal in the pass band to pass therethrough while attenuating the RF signal outside the pass band. However, in some cases, the RF signal outside the pass band cannot be attenuated to a desired value with only the filter unit 503. To cope with such a problem, a correction circuit defined by an inductor or a capacitor is disposed in the path 504. An impedance of the path 504 is set such that a phase of the second signal 506 passing through the path 504 and a phase of the first signal 505 passing through the filter unit 503 to be attenuated are opposite to each other in a frequency band outside the pass band of the filter unit 503, and such that an amplitude of the first signal 505 and an amplitude of the second signal 506 are the same in the relevant frequency band.

Accordingly, at a junction between a signal path on the output side of the filter unit 503 and a signal path on the output side of the path 504, the first signal 505 having passed through the filter unit 503 and the second signal 506 having passed through the path 504 cancel each other out in the frequency band outside the pass band of the filter unit 503, whereby the RF signal in the relevant frequency band and output from the output terminal 502 is attenuated. Thus, attenuation characteristics of the RF signal outside the pass band in the filter circuit 500 are improved. Furthermore, when another filter circuit defined by a bandpass filter for which a pass band different from that of the filter circuit 500 is set is arranged adjacent to the filter circuit 500, it is possible to suppress the RF signal outside the pass band of the filter circuit 500 from being output from the output terminal 502 and entering into the other filter circuit. Thus, isolation characteristics between the filter circuit 500 and the other filter circuit, which are arranged adjacent to each other, can be improved.

In the related-art filter circuit 500 described above, the path 504 including the correction circuit, which generates the RF signal having the phase opposite to that of the RF signal passing through the filter unit 503 and being outside the pass band, has to be disposed separately from the filter unit 503 in order to improve the attenuation characteristics for the RF signal outside the predetermined pass band. Accordingly, a problem arises in that the size of the filter circuit 500 increases and the size of a radio frequency module including the filter circuit 500 increases.

SUMMARY OF THE INVENTION

Preferred embodiments of the present invention provide a technique capable of improving not only attenuation characteristics of an RF signal outside a frequency band of a transmission signal that is input to a transmission terminal, but also isolation characteristics between a transmission filter and a reception filter without increasing the size of a radio frequency module.

A preferred embodiment of the present invention provides a radio frequency module including a transmission terminal to which a transmission signal is input, a transmission filter connected to the transmission terminal and including a ground terminal through which the transmission signal passes, a common terminal from which the transmission signal having passed through the transmission filter is output, and to which a reception signal is input, a reception filter which is connected to the common terminal, and through which the reception signal passes, a reception terminal from which the reception signal having passed through the reception filter is output, a branch point to which the common terminal, the transmission filter, and the reception filter are connected, a transmission path connecting the transmission terminal and the branch point, a reception path connecting the reception terminal and the branch point, a common path connecting the common terminal and the branch point, a matching circuit connected to the common path, and an inductor circuit including one end connected to the ground terminal and the other end connected to a ground, the inductor circuit being used to adjust characteristics of the transmission filter, wherein the inductor circuit includes a first inductor that defines a propagation path through electromagnetic coupling to at least one of the transmission path, the common path, the matching circuit, and the reception path, and a second inductor that is not electromagnetically coupled to the transmission path, the common path, the matching circuit, or the reception path.

In a preferred embodiment of the present invention, the propagation path is provided through electromagnetic coupling that is established (hereinafter "electromagnetic coupling is established" is also expressed by "electromagnetically coupled" or "connected in radio frequencies" in some cases) between the first inductor of the inductor circuit, which is used to adjust the characteristics of the transmission filter, and at least one of the transmission path, the common path, the matching circuit, and the reception path. Furthermore, phase characteristics of the transmission signal having passed through the propagation path outside a frequency band thereof are different from phase characteristics of the transmission signal input to the transmission terminal and being outside the frequency band thereof. Accordingly, an RF signal outside the frequency band of the transmission signal passing through the transmission path and an RF signal outside the frequency band of the signal passing through the propagation path are canceled out and attenuated when they are combined together.

Accordingly, in comparison with the related art in which a correction circuit is defined by adding a circuit element, such as an inductor or/and a capacitor, the propagation path to improve the filter characteristics is provided in a simpler configuration. Thus, attenuation characteristics of the RF signal outside the frequency band of the transmission signal are able to be improved without increasing the size of the radio frequency module. Moreover, the RF signal being outside the frequency band of the transmission signal and having the same or substantially the same frequency band of the reception signal is prevented from entering into the reception filter side through the signal path on the output terminal side of the transmission filter and from being output from the reception terminal. As a result, isolation characteristics between the transmission filter and the reception filter are improved.

There is a possibility that, because the inductor circuit is electromagnetically coupled to at least one of the transmission path, the common path, the matching circuit, and the reception path, an inductance of the first inductor used to adjust the attenuation characteristics of the transmission filter may vary. However, the inductor circuit in a preferred embodiment of the present invention includes the second inductor that is not electromagnetically coupled to the transmission path, the common path, the matching circuit, and the reception path, and the attenuation characteristics of the transmission filter are improved by designing the second inductor independently of the first inductor. Thus, the isolation characteristics between the transmission filter and the reception filter are improved without deteriorating the attenuation characteristics of the transmission filter.

Preferably, the radio frequency module further includes a module substrate including mounting electrodes to which the transmission terminal, the reception terminal, the common terminal, and the ground terminal are connected. The matching circuit, the inductor circuit, and a ground electrode are electrically connected to the ground. The transmission filter and the reception filter are mounted on the module substrate, and the ground electrode is located between the first inductor and the second inductor.

The module substrate may preferably include a multilayer substrate that includes a plurality of insulator layers that are laminated, and the first inductor and the second inductor are located inside the multilayer substrate so as to sandwich the ground electrode.

With the above features, since the ground electrode prevents coupling through magnetic fields generated by the first and second inductors, magnetic coupling between the first and second inductors is effectively suppressed or prevented.

One of the first inductor and the second inductor may be defined by a chip-type surface mounted component and may be mounted on the module substrate, and the other inductor may be defined by a wiring electrode that is disposed in the module substrate.

With the above features, since a distance between the first inductor and the second inductor is able to be increased to suppress or prevent the first and second inductors from being magnetically coupled to each other, the characteristics of the transmission filter are more satisfactorily improved.

The first inductor and the second inductor may be positioned so as not to overlap with each other when viewed in a plan view.

With the above feature, since the first and second inductors are suppressed or prevented from being magnetically coupled to each other, the characteristics of the transmission filter are more satisfactorily improved.

The transmission filter and the reception filter integral with each other to define a duplexer, and the second inductor may be located inside the duplexer.

With the above features, since the first and second inductors are able to be located at positions spaced from each other, the first and second inductors are effectively suppressed or prevented from being magnetically coupled to each other.

According to various preferred embodiments of the present invention, the propagation path to further improve the filter characteristics is able to be provided with a simple configuration without deteriorating the attenuation characteristics outside the frequency band of the transmission filter. Therefore, the attenuation characteristics of an RF signal outside the frequency band of the transmission signal are able to be improved without increasing the size of the radio frequency module. An RF signal being outside the frequency band of the transmission signal and having the same or substantially the same frequency as that of the reception signal is suppressed or prevented from entering into the reception filter side through a signal path on the output terminal side of the transmission filter and from being output from the reception terminal. Thus, the isolation characteristics between the transmission filter and the reception filter are improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A first preferred embodiment of a radio frequency module according to the present invention will be described below with reference to FIGS. 1 to 4. It is to be noted that, in FIGS. 1 and 2, only principal components of preferred embodiments of the present invention are illustrated, and other components are omitted for the sake of simplifying the explanation. Also, in other drawings referred to in later descriptions, only the principal components of preferred embodiments of the present invention are illustrated as in FIGS. 1 and 2, while explanation thereof is omitted in the description of the other drawings.

Figure 1:
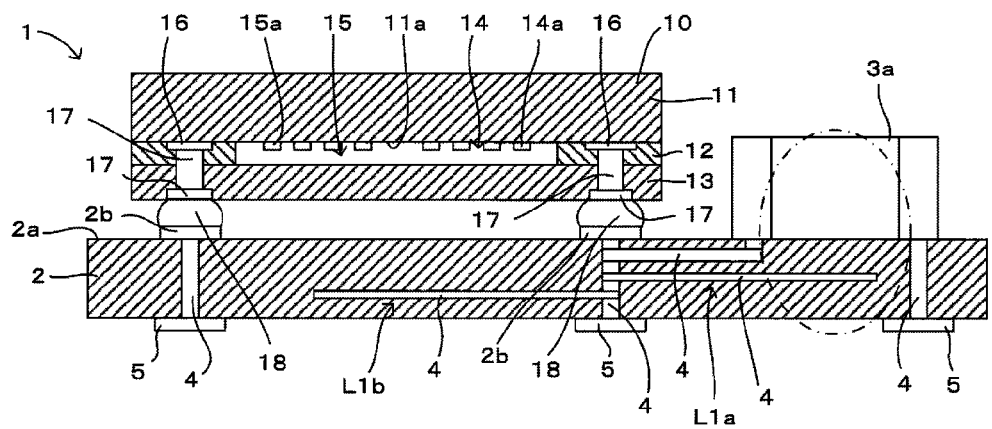
FIG. 1 is a sectional view of a radio frequency module according to a first preferred embodiment of the present invention.
Figure 2:
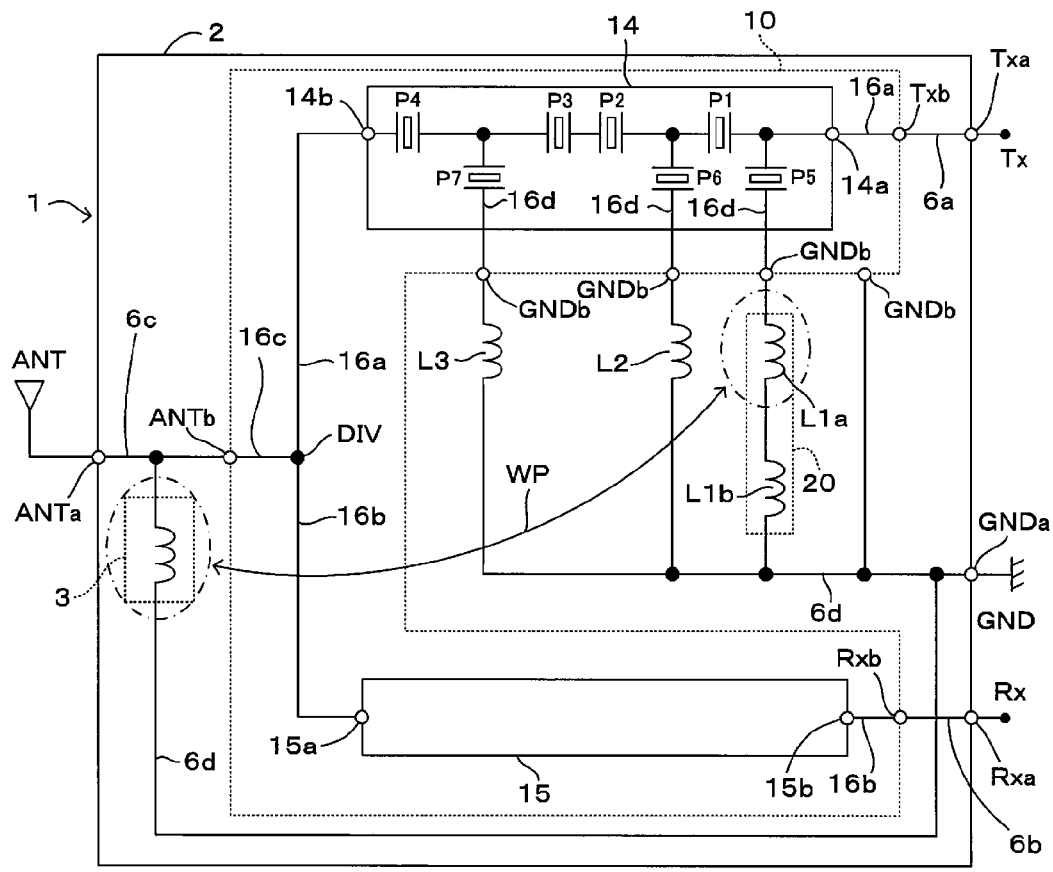
FIG. 2 is a circuit block diagram illustrating an electrical configuration of the radio frequency module of FIG. 1.

The radio frequency module 1 illustrated in FIGS. 1 and 2 is mounted on a motherboard of a communication portable terminal, e.g., a cellular phone or a portable information terminal. In this preferred embodiment, the radio frequency module 1 includes a duplexer 10 including a transmission filter 14 and a reception filter 15, a module substrate 2, a matching circuit 3, an inductor circuit 20, and various other electronic components (not illustrated) such as a switch IC, a filter, a resistor, a capacitor, and a coil, for example. The radio frequency module 1 preferably is a radio-frequency antenna switch module.

The duplexer 10, a chip-type surface mounted component 3a of the matching circuit 3, and the various other electronic components are mounted to component mounting electrodes 2b disposed on a mounting surface 2a that is a front surface of the module substrate 2. The various electronic components, such as the duplexer 10 and the matching circuit 3, are electrically connected to a plurality of mounting electrodes 5, which are provided on a rear surface of the module substrate 2 and other electronic components, through wiring electrodes 4 disposed in the module substrate 2. Furthermore, in the radio frequency module 1, a transmission terminal Txa to which a transmission signal is input, a common terminal ANTa from which the transmission signal is output and to which a reception signal is input, a reception terminal Rxa from which the reception signal having been input to the common terminal ANTa is output, and a ground terminal GNDa of the module substrate, which is connected to a substrate-side ground path 6d, are connected to the mounting electrodes 5. The ground terminal GNDa of the module substrate is grounded.

The radio frequency module 1 is mounted on the motherboard of the communication portable terminal with the mounting electrodes 5 interposed therebetween, and the transmission and reception signals are input and output between the motherboard and the radio frequency module 1.

In this preferred embodiment, the module substrate 2 is preferably a ceramic multilayer substrate that is fabricated by laminating a plurality of insulator layers, which are formed by ceramic green sheets, and by integrally firing the laminated insulating layers. More specifically, the ceramic green sheets forming the insulator layers are each obtained by molding slurry, which is a mixture of powder of alumina, glass, and other suitable materials mixed with an organic binder, a solvent, and other suitable materials, into a sheet using a molding machine to be subjected to the so-called low-temperature firing at a relatively low temperature of about 1000° C., for example. Via holes are formed in the ceramic green sheet, which has a predetermined shape after dividing the sheet having a large size, through laser processing, for example, and via conductors for interlayer connection are formed by filling a conductive paste including, e.g., Ag or Cu into the via holes, or by performing via fill plating. Moreover, various in-plane conductor patterns are formed by applying the conductive paste onto a principal surface of the ceramic green sheet.

The wiring electrodes 4, the component mounting electrodes 2b, the mounting electrodes 5, other suitable electrodes, which are used to connect the various electronic components, such as the duplexer 10 and the surface mounted component 3a, to the module substrate 2 are formed by appropriately forming the via conductors and the in-plane conductor patterns in the individual insulator layers. Circuit elements, such as capacitors and inductors, defining filter circuits and the matching circuit 3 are formed by the in-plane conductor patterns and the via conductors.

The module substrate 2 may be a single-layer substrate or a multilayer substrate preferably using, e.g., a printed substrate, an alumina-based substrate, a glass substrate, or a composite-material substrate including resin, ceramic, a polymer material or other suitable materials. The module substrate 2 may be formed so as to be adapted for the purpose of use of the radio frequency module 1 by selecting the optimum material as appropriate.

In this preferred embodiment, the matching circuit 3 is preferably an inductor defined by the chip-type surface mounted component 3a that is mounted on the mounting surface 2a of the module substrate 2. More specifically, one end of the matching circuit 3 is connected to a substrate-side common path 6c that interconnects a branch point DIV of the duplexer 10 and the common terminal ANTa of the module substrate 2, and the other end of the matching circuit 3 is connected to the ground terminal GNDa of the module substrate through a substrate-side ground path 6d that is disposed in the module substrate 2.

Respective portions of a substrate-side transmission path 6a, a substrate-side reception path 6b, and the substrate-side common path 6c are defined by the wiring electrodes 4 that are disposed in the module substrate 2. The matching circuit 3 is not limited to the configuration illustrated in FIG. 2, and the inductor may be replaced with a capacitor, or an inductor or a capacitor may be connected in series to the substrate-side common path 6c. Alternatively, the matching circuit 3 may be defined by combining an inductor and a capacitor with each other. Thus, the matching circuit 3 may have any suitable circuit configuration that is typically used to establish impedance matching between circuit elements, such as an antenna, connected to the substrate-side common terminal ANTa and the duplexer 10.

Furthermore, the inductor circuit 20 and the inductors L2 and L3 are disposed in the module substrate 2 so as to adjust attenuation characteristics outside a pass band of the transmission filter 14. Respective first ends of the inductor circuit 20 and the inductors L2 and L3 are connected to the transmission filter 14, and respective second ends thereof are connected to the ground terminal GNDa of the module substrate. Connected states of the inductor circuit 20 and the inductors L2 and L3 with respect to the transmission filter 14 will be described in detail later.

The duplexer 10 preferably has a wafer level package (WLP) structure, and includes a device substrate 11 having a rectangular or substantially rectangular shape in a plan view, a support layer 12, and a cover layer 13, for example. The transmission filter 14 and the reception filter 15 having different pass bands for an RF signal are arranged in a region surrounded by the support layer 12 and the cover layer 13. Thus, the duplexer 10 including the transmission filter 14 and the reception filter 15 integrally provided therein is obtained.

In this preferred embodiment, the device substrate 11 is preferably a piezoelectric body of, e.g., lithium niobate, lithium tantalate, or quartz. IDT (interdigital transducer) electrodes (comb-shaped electrodes) and reflectors, which are preferably made of, e.g., Al or Cu, are disposed in a predetermined region of one principal surface 11a of the device substrate 11 to define a SAW (surface acoustic wave) filter. In this preferred embodiment, the transmission filter 14 and the reception filter 15 are both provided on the principal surface 11a.

Moreover, terminal electrodes 16 connected to the IDT electrodes and the reflectors are disposed on the one principal surface 11a of the device substrate 11. Electrodes 17 penetrating through the support layer 12 and the cover layer 13 are connected to the terminal electrodes 16, respectively. An intra-duplexer transmission terminal Txb, an intra-duplexer reception terminal Rxb, an intra-duplexer common terminal ANTb, and a plurality of intra-duplexer ground terminals GNDb of the duplexer 10 are connected to the electrodes 17. An input terminal 14a of the transmission filter 14 and the intra-duplexer transmission terminal Txb are connected through a portion of an intra-duplexer transmission path 16a that is defined by wiring electrodes provided on the one principal surface 11a of the device substrate 11, an electrode penetrating through the support layer 12, and the cover layer 13, for example. An output terminal 15b of the reception filter 15 and the intra-duplexer reception terminal Rxb are connected through a portion of an intra-duplexer reception path 16b having a similar structure to that of the intra-duplexer transmission path 16a. An output terminal 14b of the transmission filter 14 and the branch point DIV are connected through another portion of the intra-duplexer transmission path 16a, and an input terminal 15a of the reception filter 15 and the branch point DIV are connected through another portion of the intra-duplexer reception path 16b. In addition, resonators defined by the IDT electrodes (comb-shaped electrodes) and the reflectors, which define the transmission filter 14 and the reception filter 15 (i.e., the SAW filter devices), are connected to the intra-duplexer ground terminals GNDb through intra-duplexer ground paths 16d.

The intra-duplexer transmission path 16a, the intra-duplexer reception path 16b, the intra-duplexer common path 16c, and the intra-duplexer ground paths 16d are defined by the wiring electrodes (not illustrated) and the terminal electrodes 16, which are provided on the one principal surface 11a of the device substrate 11.

The support layer 12 surrounds the predetermined region of the one principal surface 11a of the device substrate 11 at which the IDT electrodes and the reflectors are disposed. More specifically, the support layer 12 is formed preferably by forming a resin layer with a photosensitive epoxy resin or polyimide resin on the principal surface 11a of the device substrate 11 where the IDT electrodes, the reflectors, and the terminal electrodes 16 are disposed, and then by removing, through a photolithography step, the resin layer in the predetermined region where the IDT electrodes and the reflectors are disposed and in regions corresponding to the terminal electrodes 16.

The cover layer 13 is located on the support layer 12 to provide a space between the cover layer 13 and the device substrate 11 and being surrounded by the support layer 12. The transmission filter 14 and the reception filter 15 are located in the space. More specifically, the cover layer 13 is formed, for example, preferably by laminating a resin layer of a photosensitive epoxy resin or polyimide resin on the support layer 12, forming connection holes in the laminated resin layer with a photolithography step, and by filling a paste including Cu or Al into the connection holes, or by executing via fill plating in the connection holes, thus forming the electrodes 17 connected to the terminal electrodes 16. Solder balls 18 used for mounting are provided on the electrodes 17 that are connected to the terminal electrodes 16, respectively, and that are exposed at a principal surface of the cover layer 13 on the side opposite to the space where the transmission filter 14 and the reception filter 15 (SAW filter devices) are located. The duplexer 10 preferably is formed in this manner.

Upon the duplexer 10 being mounted to the mounting surface 2a of the module substrate 2 in a state where the cover layer 13 is positioned to face the mounting surface 2a, the substrate-side transmission terminal Txa and the input terminal 14a of the transmission filter 14 are connected through the intra-duplexer transmission terminal Txb. Furthermore, the substrate-side reception terminal Rxa and the output terminal 15b of the reception filter 15 are connected through the intra-duplexer reception terminal Rxb. The substrate-side common terminal ANTa of the module substrate 2 and the intra-duplexer common terminal ANTb of the duplexer 10 are connected through the substrate-side common path 6c, and the intra-duplexer common terminal ANTb and the branch point DIV are connected through the intra-duplexer common path 16c. In addition, the substrate-side ground terminal GNDa of the module substrate 2 and the intra-duplexer ground terminals GNDb of the duplexer 10 are connected through the substrate-side ground paths 6d, and the ground terminals GNDb of the filters 14 and 15 are grounded through the ground terminal GNDa of the module substrate.

The substrate-side transmission path 6a, the substrate-side reception path 6b, the substrate-side common path 6c, and the substrate-side ground path 6d are defined by the wiring electrodes 4 that are disposed on the module substrate 2. Furthermore, the substrate-side transmission path 6a and the intra-duplexer transmission path 16a define not only a path connecting the transmission terminal Txa and the input terminal 14a of the transmission filter 14, but also a path connecting the branch point DIV and the output terminal 14b of the transmission filter 14, thus defining a "transmission path" in a preferred embodiment of the present invention. The substrate-side reception path 6b and the intra-duplexer reception path 16b define not only a path connecting the reception terminal Rxa and the output terminal 15b of the reception filter 15, but also a path connecting the branch point DIV and the input terminal 15a of the reception filter 15, thus defining a "reception path" in a preferred embodiment of the present invention. Moreover, the substrate-side common path 6c and the intra-duplexer common path 16c define a "common path" in a preferred embodiment of the present invention, which connects the common terminal ANTa and the branch point DIV.

Preferred configurations of the transmission filter 14 and the reception filter 15 will be described below. A frequency band of the transmission signal is set as the pass band of the transmission filter 14, and a frequency band of the reception signal, which is different from the frequency band of the transmission signal, is set as the pass band of the reception filter 15.

The transmission filter 14 outputs the transmission signal in a first frequency band, which is input from the intra-duplexer transmission terminal Txb, to the intra-duplexer common terminal ANTb. The transmission filter 14 is formed preferably by connecting the resonators, which include the IDT electrodes and the reflectors, in a ladder pattern in one of regions of the one principal surface 11a of the device substrate 11, the regions being divided by an imaginary line that extends perpendicular or substantially perpendicular to a pair of opposite sides of the device substrate 11 and that passes the intra-duplexer common terminal ANTb. More specifically, the transmission filter 14 includes a plurality (for example, four in this preferred embodiment) of resonators P1 to P4 arranged in series in the transmission path (i.e., the intra-duplexer transmission path 16a) connecting the input terminal 14a and the output terminal 14b of the transmission filter 14, and a plurality (three in this preferred embodiment) of resonators P5 to P7 connected respectively between connection junctions to the resonators P1 to P4 and the intra-duplexer ground terminals GNDb. The resonators P1 to P4 are serial arm resonators, and the resonators P5 to P7 are parallel arm resonators.

The parallel arm resonator P5 includes one end connected to the transmission path between the serial arm resonator P1 and the input terminal 14a, and the other end connected to the intra-duplexer ground terminal GNDb through the intra-duplexer ground path 16d. The intra-duplexer ground terminal GNDb to which the other terminal of the parallel arm resonator P5 is connected is connected to the ground terminal GNDa of the module substrate through the inductor circuit 20, which is a serial circuit of a first inductor L1a and a second inductor L1b, and through the substrate-side ground path 6d.

The parallel arm resonator P6 includes one end connected to the transmission path between the serial arm resonators P1 and P2, and the other end connected to the intra-duplexer ground terminal GNDb through the intra-duplexer ground path 16d. The intra-duplexer ground terminal GNDb to which the other terminal of the parallel arm resonator P6 is connected is connected to the ground through the inductor L2 and through the ground terminal GNDa of the module substrate. The parallel arm resonator P7 includes one end connected to the transmission path between the serial arm resonators P3 and P4, and the other end connected to the intra-duplexer ground terminal GNDb through the intra-duplexer ground path 16d. The intra-duplexer ground terminal GNDb to which the parallel arm resonator P7 is connected is connected to the ground through the inductor L3 and through the ground terminal GNDa of the module substrate.

The attenuation characteristics of the transmission filter 14 can be adjusted by appropriately adjusting respective inductances of the inductors L1a, L1b, L2 and L3. More specifically, an attenuation pole is able to be provided at a position of a desired frequency outside the pass band of the transmission filter 14 in the lower frequency side or the higher frequency side by adjusting the respective inductances of the inductors L1a, L1b, L2 and L3. The resonators P1 to P7 are each formed preferably by arranging reflectors on both sides of the paired IDT electrodes in a direction in which surface acoustic waves propagate. Though not illustrated, the resonators P1 to P7 are each connected to the intra-duplexer ground terminal GNDb through the intra-duplexer ground path 16d, and further connected to the ground terminal GNDa of the module substrate through the substrate-side ground path 6d.

The reception filter 15 outputs the reception signal in a second frequency band, which is input to the intra-duplexer common terminal ANTb, to the intra-duplexer reception terminal Rxb. The reception filter 15 is formed preferably by connecting the resonators, which include the IDT electrodes and the reflectors, in another one of regions of the one principal surface 11a of the device substrate 11, the regions being divided by the imaginary line that extends perpendicular or substantially perpendicular to a pair of opposite sides of the device substrate 11 and that passes the intra-duplexer common terminal ANTb. While the reception filter 15 is formed, for example, by connecting a resonator defining a phase shifter and a longitudinally-coupled resonator defining a bandpass filter in series, detailed description of the reception filter 15 is omitted. Moreover, though not illustrated as in the transmission filter 14 described above, the resonators defining the reception filter 15 are each connected to the intra-duplexer ground terminal GNDb through the intra-duplexer ground path 16d, and further connected to the ground terminal GNDa of the module substrate through the substrate-side ground path 6d.

The reception filter 15 may preferably be a balance type filter in which two intra-duplexer reception terminals Rxb are disposed and the reception signal is output in a balanced state, for example.

In this preferred embodiment, the inductors L1a, L1b, L2 and L3 that adjust characteristics of the transmission filter in the duplexer 10 are defined by the wiring electrodes 4 provided in the module substrate 2. The inductor circuit 20 includes the first and second inductors L1a and L1b that are connected in series. Furthermore, as illustrated in FIG. 1, the wiring electrode 4 defining the first inductor L1a is located just under the surface mounted component (inductor 3a), and any shielding ground electrode, which is defined by, e.g., the wiring electrode 4 connected to the ground terminal GNDa of the module substrate, is not located between the wiring electrode 4 defining the first inductor L1a and the duplexer 10. In addition, the wiring electrode 4 defining the second inductor L1b is not overlapped with the first inductor L1a when viewed in a plan view.

Accordingly, in this preferred embodiment, when an RF signal flows through the signal path of the radio frequency module 1, the first inductor L1a and the inductor of the matching circuit 3 are connected in radio frequencies through electromagnetic coupling, thus providing a propagation path WP that connects the intra-duplexer common terminal ANTb and the signal path on the output terminal side of the transmission filter 14, as illustrated in FIG. 2 and more specifically as denoted by regions surrounded by the one-dot-chain lines in FIG. 2. A degree of the electromagnetic coupling which provides the propagation path WP is adjusted such that a phase of the RF signal outside the frequency band of the transmission signal passing through the propagation path WP is opposite to a phase of the RF signal outside the frequency band of the transmission signal passing through the transmission filter 14, and such that amplitudes of both of the RF signals are the same or substantially the same. In addition, the second inductor L1b is positioned so as not to be electromagnetically coupled to the substrate-side transmission path 6a, the intra-duplexer transmission path 16a, the substrate-side reception path 6b, the intra-duplexer reception path 16b, the substrate-side common path 6c, the intra-duplexer common path 16c, the matching circuit 3, or the reception filter 15.

In the radio frequency module 1 described above, the transmission signal output from the motherboard of the cellular phone, for example, to the intra-duplexer transmission terminal Txb of the duplexer 10 through the mounting electrode 5 and the wiring electrode 4 is input to the transmission filter 14, and is subjected to a predetermined filtering process. Thereafter, the transmission signal is output to the module substrate 2 side from the intra-duplexer common terminal ANTb, and is further output to the motherboard of the cellular phone through the wiring electrode 4 (i.e., the matching circuit 3) and the mounting electrode 5. On the other hand, the reception signal input to the intra-duplexer common terminal ANTb of the duplexer from, e.g., the antenna of the cellular phone through the mounting electrode 5 and the wiring electrode 4 (i.e., the matching circuit 3) is input to the reception filter 15, and is subjected to a predetermined filtering process. Thereafter, the reception signal is output to the module substrate 2 side from the intra-duplexer reception terminal Rxb, and is further output to the motherboard side through the wiring electrode 4 and the mounting electrode 5.

Isolation characteristics of the radio frequency module 1 will be described below with reference to FIG. 3, and bandpass characteristics of the radio frequency module 1 will be described below with reference to FIG. 4.

Figure 3:
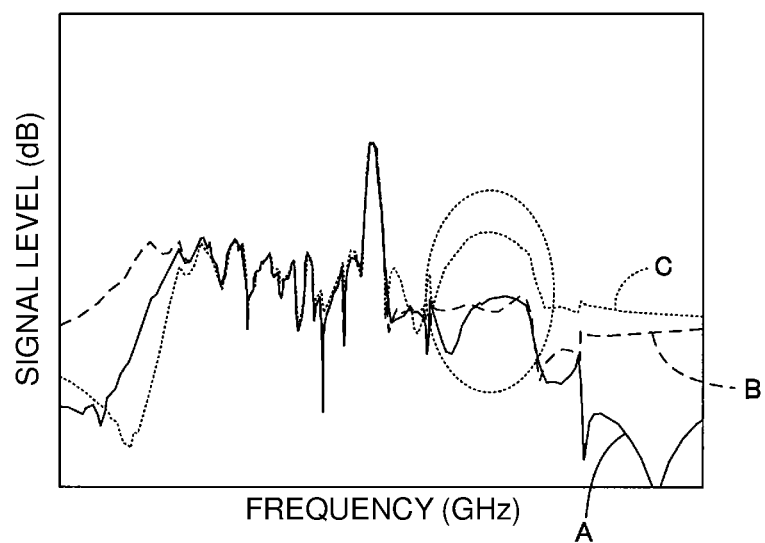
FIG. 3 is a graph depicting isolation characteristics between a transmission filter and a reception filter.

The isolation characteristics depicted in FIG. 3 represent, when an RF signal in an arbitrary frequency range including the frequency band of the reception signal is input to the transmission terminal Txa, a level of the RF signal observed at the reception terminal Rxa. The horizontal axis of FIG. 3 indicates the frequency (GHz) of the RF signal input to the transmission terminal Txa, and the vertical axis indicates a signal level (dB) of the RF signal observed at the reception terminal Rxa.

A solid line A in FIG. 3 represents the isolation characteristics when the predetermined RF signal is input to the radio frequency module 1 including the propagation path WP that is provided through the electromagnetic coupling as described above, and further including the inductor L1b that is positioned so as not to be electromagnetically coupled to the other elements. A broken line B in FIG. 3 represents, as one comparative example, the isolation characteristics when the propagation path WP is provided, but the second inductor L1b is not provided. A dotted line C in FIG. 3 represents, as another comparative example, the isolation characteristics when the predetermined RF signal is input to a radio frequency module in which the propagation path WP is not provided.

As seen from the region surrounded by a dotted line in FIG. 3, in the case in which the propagation path WP is provided (corresponding to the solid line A and the broken line B), the isolation characteristics in the frequency band (for example, about 1.8 GHz to about 1.9 GHz in this preferred embodiment) of the reception signal are improved by about 10 dB as compared to the case in which the propagation path WP is not provided (corresponding to the dotted line C).

Figure 4:
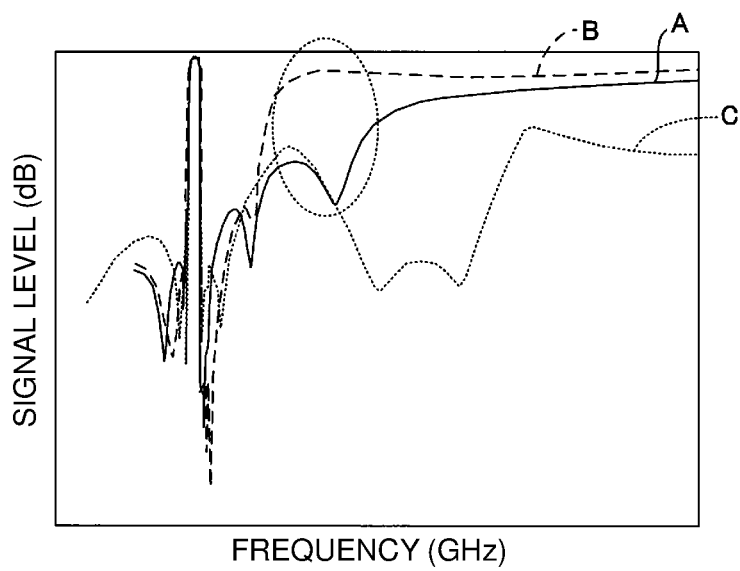
FIG. 4 is a graph depicting bandpass characteristics of the transmission filter.

The passband characteristics depicted in FIG. 4 represent, when an RF signal in an arbitrary frequency range including harmonic components of the transmission signal is input to the transmission terminal Txa, a level of the RF signal observed at the common terminal ANTa. The horizontal axis of FIG. 4 indicates the frequency (GHz) of the RF signal input to the transmission terminal Txa, and the vertical axis indicates a signal level (dB) of the RF signal observed at the common terminal ANTa.

A solid line A in FIG. 4 represents the passband characteristics when the predetermined RF signal is input to the radio frequency module 1 including the propagation path WP that is provided through the electromagnetic coupling as described above, and further including the inductor L1b that is positioned so as not to be electromagnetically coupled to the other elements. A broken line B in FIG. 4 represents, as one comparative example, the passband characteristics when the propagation path WP is provided, but the second inductor L1b is not provided. A dotted line C in FIG. 4 represents, as another comparative example, the passband characteristics when the predetermined RF signal is input to a radio frequency module in which the propagation path WP is not provided.

As seen from the region surrounded by a dotted line in FIG. 4, in the case in which the propagation path WP is provided, but the second inductor L1b is not provided (corresponding to the broken line B), the attenuation characteristics are deteriorated in a frequency band of the second harmonic component. On the other hand, in the case in which the second inductor L1b is provided (corresponding to the solid line A), the attenuation characteristics are the same or substantially the same in the frequency band of the second harmonic component as those in the case in which the propagation path WP is not provided (corresponding to the dotted line C).

In this preferred embodiment, as described above, the matching circuit 3 is connected to the substrate-side common path 6c that connects the common terminal ANTa and the intra-duplexer common terminal ANTb of the duplexer 10. Respective first ends of the inductor circuit 20 and the inductors L2 and L3 to adjust the characteristics of the transmission filter 14 are connected to the transmission filter 14, and the other ends thereof are connected to the ground terminal GNDa of the module substrate. Furthermore, the first inductor L1a is positioned such that the propagation path WP connected to the signal path on the output terminal side of the transmission filter 14 is provided by the connection between the first inductor L1a of the inductor circuit 20, which is connected to the transmission filter 14, and the matching circuit 3 through electromagnetic coupling. Therefore, an RF signal input to the transmission terminal Txa and including the transmission signal passes through the transmission filter 14 and the propagation path WP separately. Thereafter, the separated RF signals are combined with each other in the signal path on the output terminal side of the transmission filter 14, to which the propagation path WP is connected.

A degree of the electromagnetic coupling providing the propagation path WP, which is branched from the transmission filter 14, is adjusted such that phase characteristics of second and third harmonics, i.e., of an RF signal outside the frequency band of the signal passing through the propagation path WP, are different from phase characteristics of the second and third harmonics of the transmission signal passing through the transmission filter 14. Thus, when the electromagnetic coupling between the matching circuit 3 and the inductor L1a is adjusted such that a phase difference between an RF signal including the harmonics of the transmission signal passing through the transmission filter 14 and an RF signal including the harmonics of the signal passing through the propagation path WP is about 180°, those two RF signals are canceled out and attenuated when they are combined together.

Accordingly, as compared to the related art in which a correction circuit is defined by adding a circuit element, such as an inductor or/and a capacitor, the propagation path WP to improve the filter characteristics is able to be provided in a simpler configuration by using the existing components of the filter circuit. Thus, the attenuation characteristics of the RF signal outside the frequency band of the transmission signal are able to be improved without increasing the size of the radio frequency module 1. Furthermore, the RF signal being outside the frequency band of the transmission signal and having the same or substantially the same frequency band of the reception signal is suppressed or prevented from entering into the reception filter 15 side through the signal path on the output terminal side of the transmission filter 14 and from being output from the reception terminal Rxa. As a result, the isolation characteristics between the transmission filter 14 and the reception filter 15 are improved.

When the RF signal in the frequency band of the reception signal flows through the transmission filter 14, the relevant RF signal in the frequency band of the reception signal, i.e., the signal outside the frequency band of the transmission signal, is canceled as described above, and the attenuation characteristics of the RF signal in the frequency band of the reception signal in the transmission filter 14 are improved. Accordingly, the RF signal in the frequency band of the reception signal is able to be suppressed or prevented from entering into the signal path on the reception filter 15 side after passing through the transmission filter 14, and the isolation characteristics between the transmission filter 14 and the reception filter 15 are improved.

The degree of the electromagnetic coupling providing the propagation path WP is able to be adjusted by moving the position of the first inductor L1a such that a distance between the signal path, which is to be electromagnetically coupled to the first inductor L1a, and the first inductor L1a is changed. Moreover, respective degrees of electric-field coupling (capacitive coupling) and magnetic-field coupling (inductive coupling), which provide the propagation path WP, are preferably set depending primarily on the frequency bands to be attenuated, e.g., on the harmonic components included in the RF signal input to the transmission terminal TXa and on the RF signal in the same frequency band as that of the reception signal.

There is a possibility that inductance characteristics of the first inductor L1a may vary with the electromagnetic coupling to the matching circuit 3. However, the attenuation characteristics of the transmission filter 14 are able to be improved by designing the second inductor L1b, which is arranged so as not to be electromagnetically coupled to the other elements and the signal paths in the radio frequency module 1, to have the desired attenuation characteristics. Accordingly, the isolation characteristics between the transmission filter 14 and the reception filter 15 are able to be improved without deteriorating the attenuation characteristics in the frequency band, particularly outside the passband of the transmission filter 14.

Since no shielding electrode connected to the ground terminal GNDa of the module substrate is located between the wiring electrode 4, which defines the first inductor L1a arranged just under the surface mounted component 3a of the matching circuit 3, and the duplexer 10, the inductor defining the matching circuit 3 and the first inductor L1a disposed in the module substrate 2 are able to be electromagnetically coupled to each other with higher reliability.

The attenuation characteristics of the ladder-type transmission filter 14 utilizing acoustic waves are able to be effectively adjusted by the inductor circuit 20 and the inductors L2 and L3, which are connected respectively to the parallel arm resonators P5 to P7 connected between the connection junctions to the resonators P1 to P4 and the ground terminal GNDa of the module substrate.

Moreover, the support layer 12 surrounds the predetermined region of the one principal surface 11a of the device substrate 11 where not only the serial arm resonators P1 to P4 and the parallel arm resonators P5 to P7 both defining the transmission filter 14, but also the resonators defining the reception filter 15 are disposed, and the cover layer 13 is laminated on the support layer 12 such that a space surrounded by the support layer 12 is defined between the cover layer 13 and the device substrate 11. Accordingly, the radio frequency module 1 is able to be provided to have a practical configuration in which the duplexer 10 of the wafer level package (WLP) structure is mounted on the module substrate 2.

In this preferred embodiment, since the first inductor L1a and the second inductor L1b are positioned so as not to be overlapped with each other when viewed in a plan view, the first and second inductors L1a and L1b are able to be suppressed or prevented from being electromagnetically coupled to each other, and the characteristics of the transmission filter 14 are more satisfactorily improved.

Second Preferred Embodiment

A second preferred embodiment of the radio frequency module according to the present invention will be described below with reference to FIGS. 5 and 6.

Figure 5:
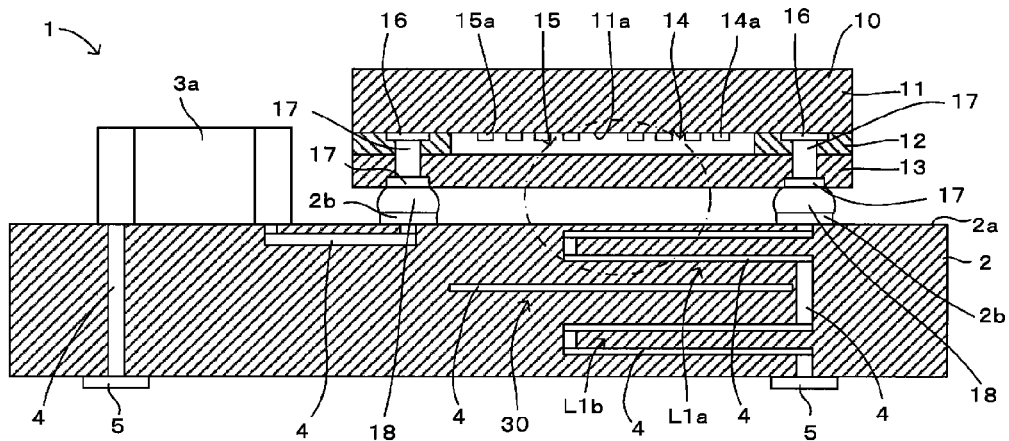
FIG. 5 is a sectional view of a radio frequency module according to a second preferred embodiment of the present invention.
Figure 6:
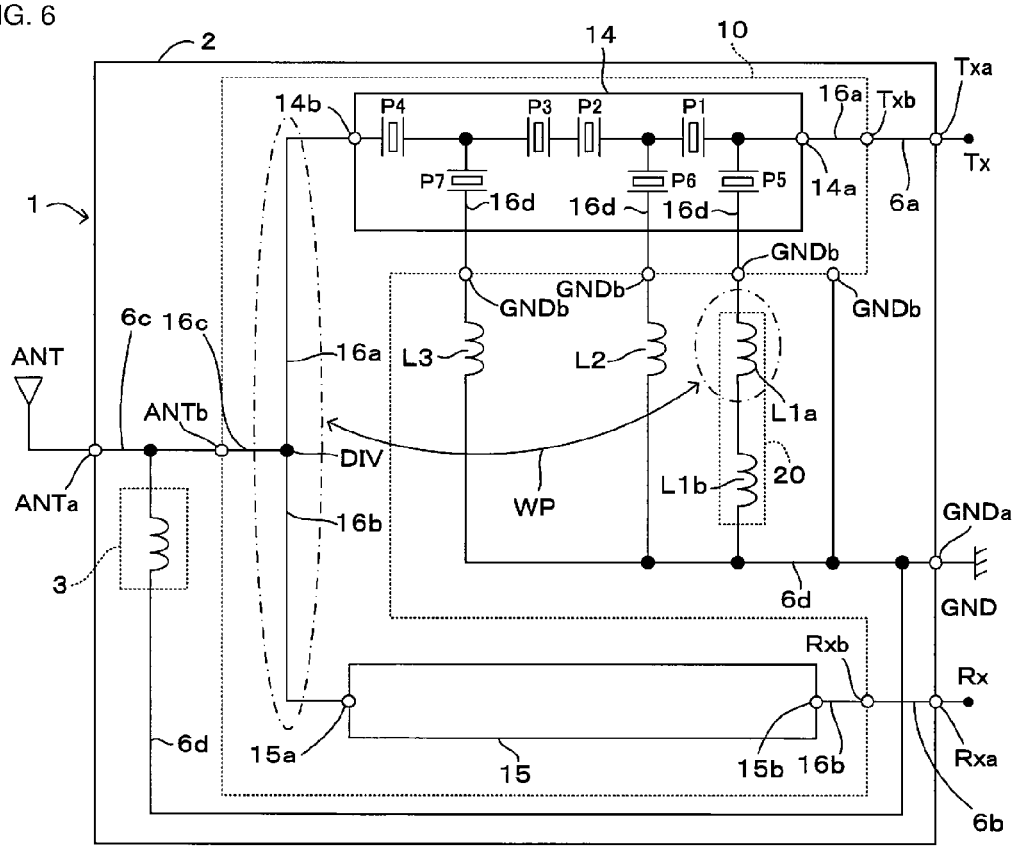
FIG. 6 is a circuit block diagram illustrating an electrical configuration of the radio frequency module of FIG. 5.

This preferred embodiment is different from the first preferred embodiment in that, as illustrated in FIGS. 5 and 6, the wiring electrode 4 defining the first inductor L1a is located just under the duplexer 10, and that the first inductor L1a and the intra-duplexer transmission path 16a or the intra-duplexer reception path 16b are connected to each other in radio frequencies through electromagnetic coupling, such that the propagation path WP is provided. Furthermore, between the first inductor L1a and the second inductor L1b, a shielding ground electrode 30 defined by the wiring electrode 4 connected to the ground terminal GNDa of the module substrate is located between the first inductor L1a and the second inductor L1b to suppress or prevent electromagnetic coupling between the first inductor L1a and the second inductor L1b. The other configuration is similar to that in the first preferred embodiment, and a description of the other configuration is omitted while the same reference signs as those in the first preferred embodiment are used.

In this preferred embodiment, the first and second inductors L1a and L1b are able to be suppressed or prevented from being electromagnetically coupled to each other by the shielding ground electrode 30. With such a configuration, the first inductor L1a is able to provide a separate propagation path WP allowing a portion of the transmission signal to pass therethrough, while the isolation characteristics are improved. Furthermore, since the shielding ground electrode 30 suppresses or prevents the second inductor L1b from being electromagnetically coupled to the first inductor L1a that provides the separate propagation path WP, the attenuation characteristics of the transmission filter 14 are able to be independently designed by using the second inductor L1b, and thus, the characteristics of the transmission filter 14 are more satisfactorily improved. Even when the propagation path WP is provided by connecting the first inductor L1a and the intra-duplexer common path 16c to each other in radio frequencies through electromagnetic coupling, similar advantageous effects are obtained.

Third Preferred Embodiment

Figure 7:
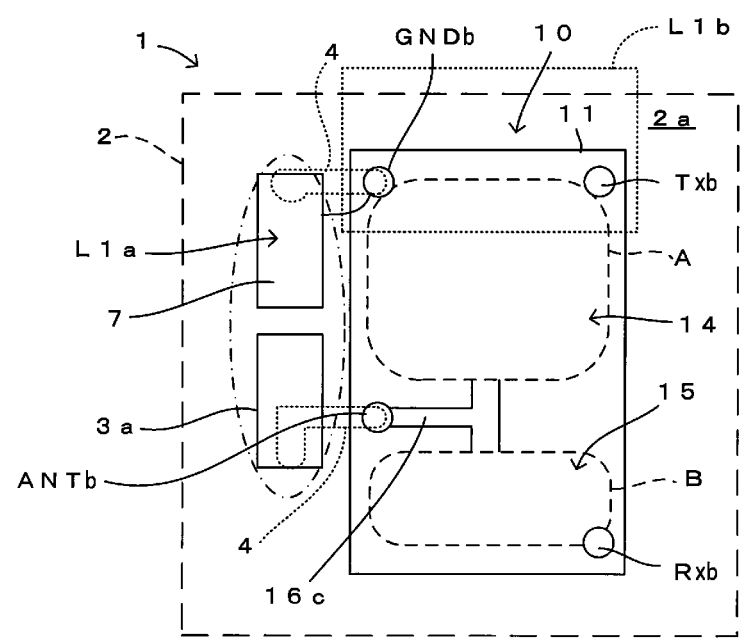
FIG. 7 is a plan view illustrating a positional relationship between an inductor and a matching circuit, which are arranged around a duplexer in a radio frequency module according to a third preferred embodiment of the present invention.

A third preferred embodiment of the radio frequency module according to the present invention will be described below with reference to FIG. 7. FIG. 7 is a plan view of a (principal) portion of the module substrate 2 of the radio frequency module 1 when viewed from the side facing the mounting surface 2a.

This preferred embodiment is different from the first preferred embodiment in that, as illustrated in FIG. 7, a chip-type surface mounted component 7 defining the first inductor L1a and the chip-type surface mounted component 3a (inductor) defining the matching circuit 3 are mounted to the mounting surface 2a of the module substrate 2, and in that the surface mounted component 7 and the surface mounted component 3a are adjacent to each other. Moreover, as illustrated in FIG. 7, the surface mounted component 7 is positioned so as not to be overlapped with a region in which the wiring electrode 4 defining the second inductor L1b is arranged, when viewed in a plan view. The remaining configuration is similar to that in the first preferred embodiment, and thus, a description of the remaining configuration is omitted while the same reference signs as those in the first preferred embodiment are used.

In this preferred embodiment, since the surface mounted component 7 defining the first inductor L1a is arranged adjacent to the surface mounted component 3a defining the matching circuit 3, the matching circuit 3 and the first inductor L1a are able to be electromagnetically coupled to each other. Furthermore, since the first inductor L1a and the second inductor L1b are positioned at spaced apart locations, the first and second inductors L1a and L1b are able to be suppressed or prevented from being electromagnetically coupled to each other.

Since the first inductor L1a is defined by the chip-type surface mounted component 7, the inductance of the first inductor L1a is able to be more easily adjusted by selecting a chip-type inductor (surface mounted component 7), which has a desired inductance value, as compared to the case in which the first inductor L1a is defined by the wiring electrode 4 disposed in the module substrate 2. Moreover, since the matching circuit is defined by the chip-type surface mounted component 3a, a degree of the electromagnetic coupling between the two chip-type inductors (surface mounted components 3a and 7) is able to be more easily adjusted by appropriately selecting the spacing between the two inductors (surface mounted components 3a and 7) and the locations thereof as compared to the case in which the matching circuit 3 is defined by the wiring electrode 4 disposed in the module substrate 2.

Additionally, the second inductor L1b may be defined by a surface mounted component positioned to not be electromagnetically coupled to the other circuits. As an alternative, the first and second inductors L1a and L1b may both be defined by the plurality of surface mounted components 7.

Fourth Preferred Embodiment

A fourth preferred embodiment of the radio frequency module according to the present invention will be described below with reference to FIG. 8.

Figure 8:
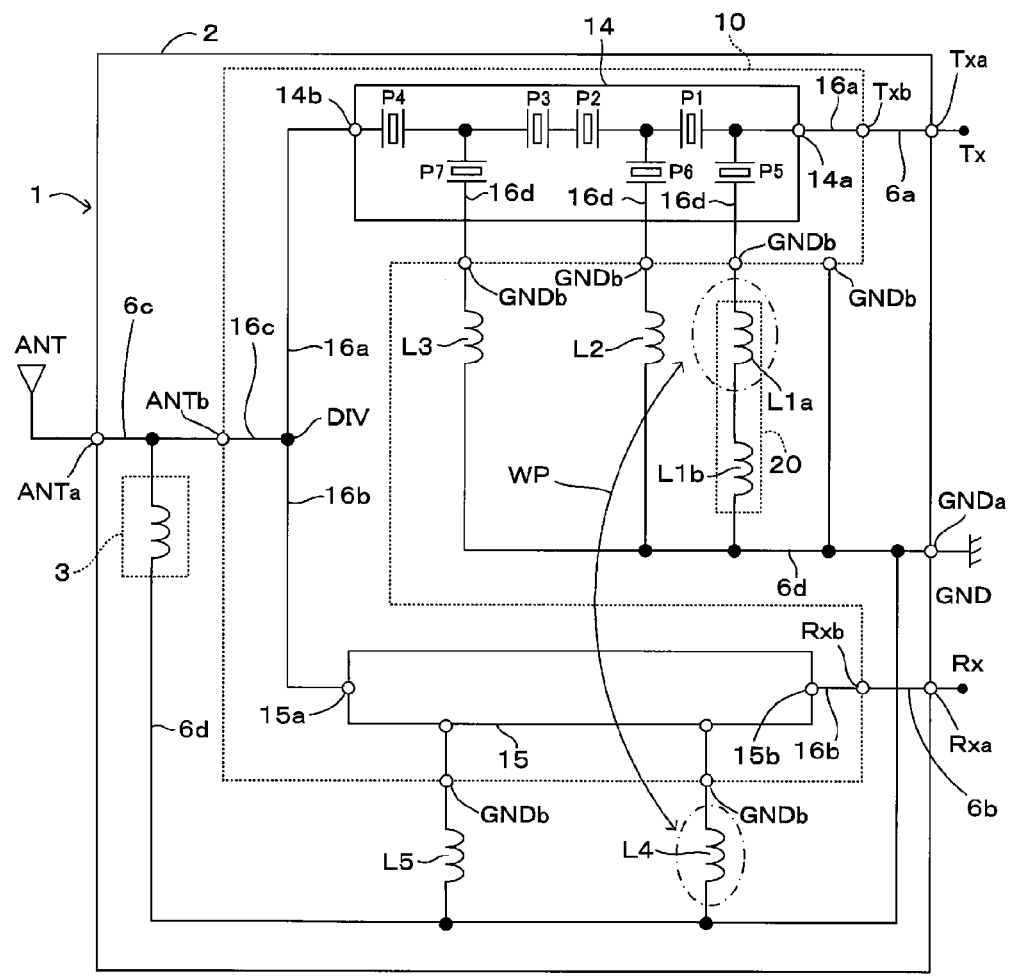
FIG. 8 is a circuit block diagram illustrating an electrical configuration of a radio frequency module according to a fourth preferred embodiment of the present invention.

This preferred embodiment is different from the above first preferred embodiment in that, as illustrated in FIG. 8, inductors L4 and L5 that adjust the characteristics of the reception filter 15 are connected in shunt to the reception filter 15, and in that the inductor L4 and the first inductor L1a are connected to each other through electromagnetic coupling, such that the propagation path WP is provided. Even with such a configuration, the isolation characteristics and the attenuation characteristics of the radio frequency module 1 are effectively improved. The remaining configuration is similar to that in the first preferred embodiment, and thus, a description of the remaining configuration is omitted while the same reference signs as those in the first preferred embodiment are used.

Fifth Preferred Embodiment

A fifth preferred embodiment of the radio frequency module according to the present invention will be described below with reference to FIG. 9.

Figure 9:
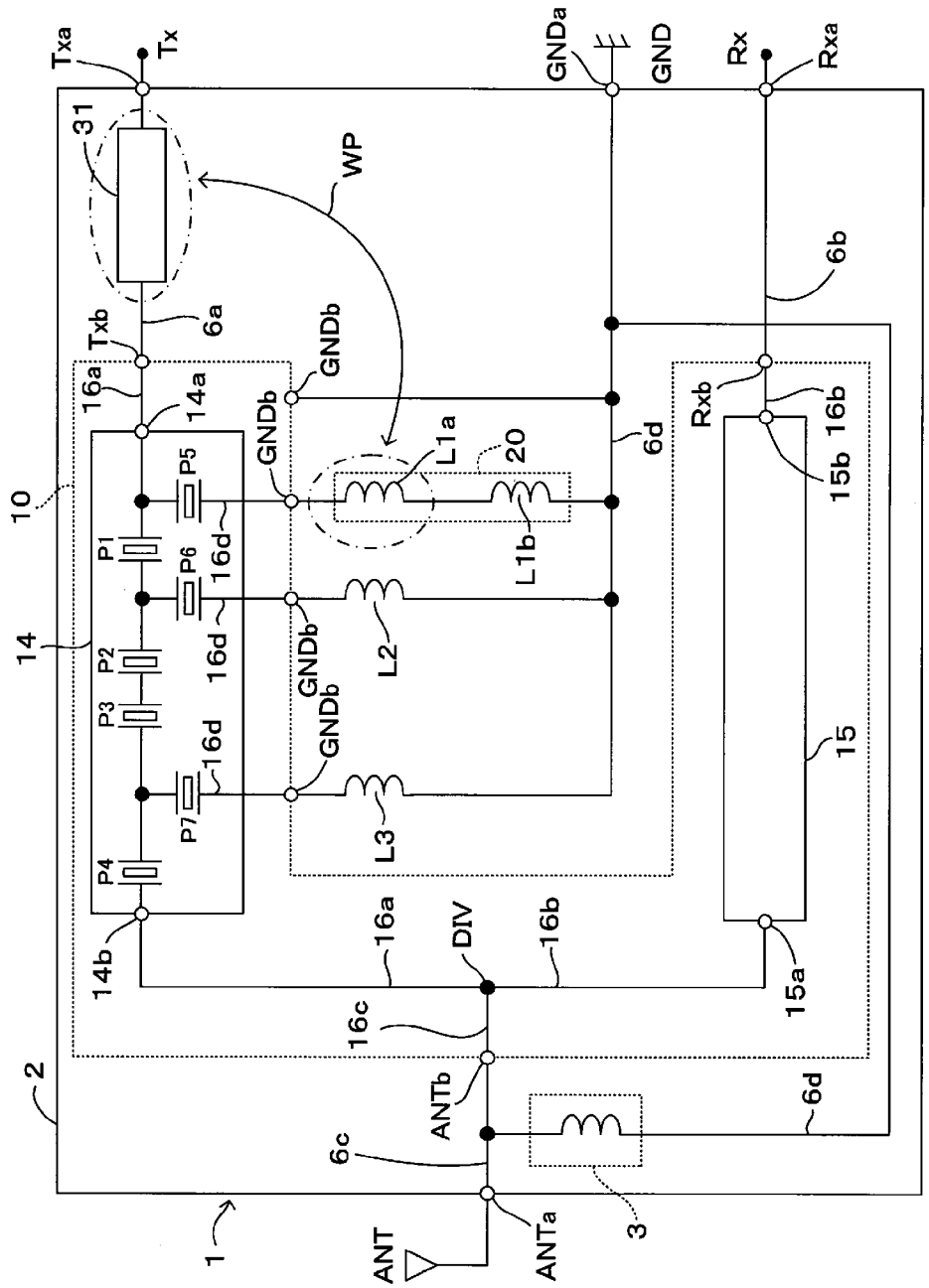
FIG. 9 is a circuit block diagram illustrating an electrical configuration of a radio frequency module according to a fifth preferred embodiment of the present invention.

This preferred embodiment is different from the first preferred embodiment in that, as illustrated in FIG. 9, a matching circuit 31 inserted in the substrate-side transmission path 6a and the first inductor L1a are electromagnetically coupled to each other, such that the propagation path WP is provided between the substrate-side transmission path 6a and the first inductor L1a. Even with such a configuration, the isolation characteristics and the attenuation characteristics of the radio frequency module 1 are effectively improved. The remaining configuration is similar to that in the first preferred embodiment, and thus, a description of the remaining configuration is omitted while the same reference signs as those in the first preferred embodiment are used.

Sixth Preferred Embodiment

A sixth preferred embodiment of the radio frequency module according to the present invention will be described below with reference to FIG. 10.

Figure 10:
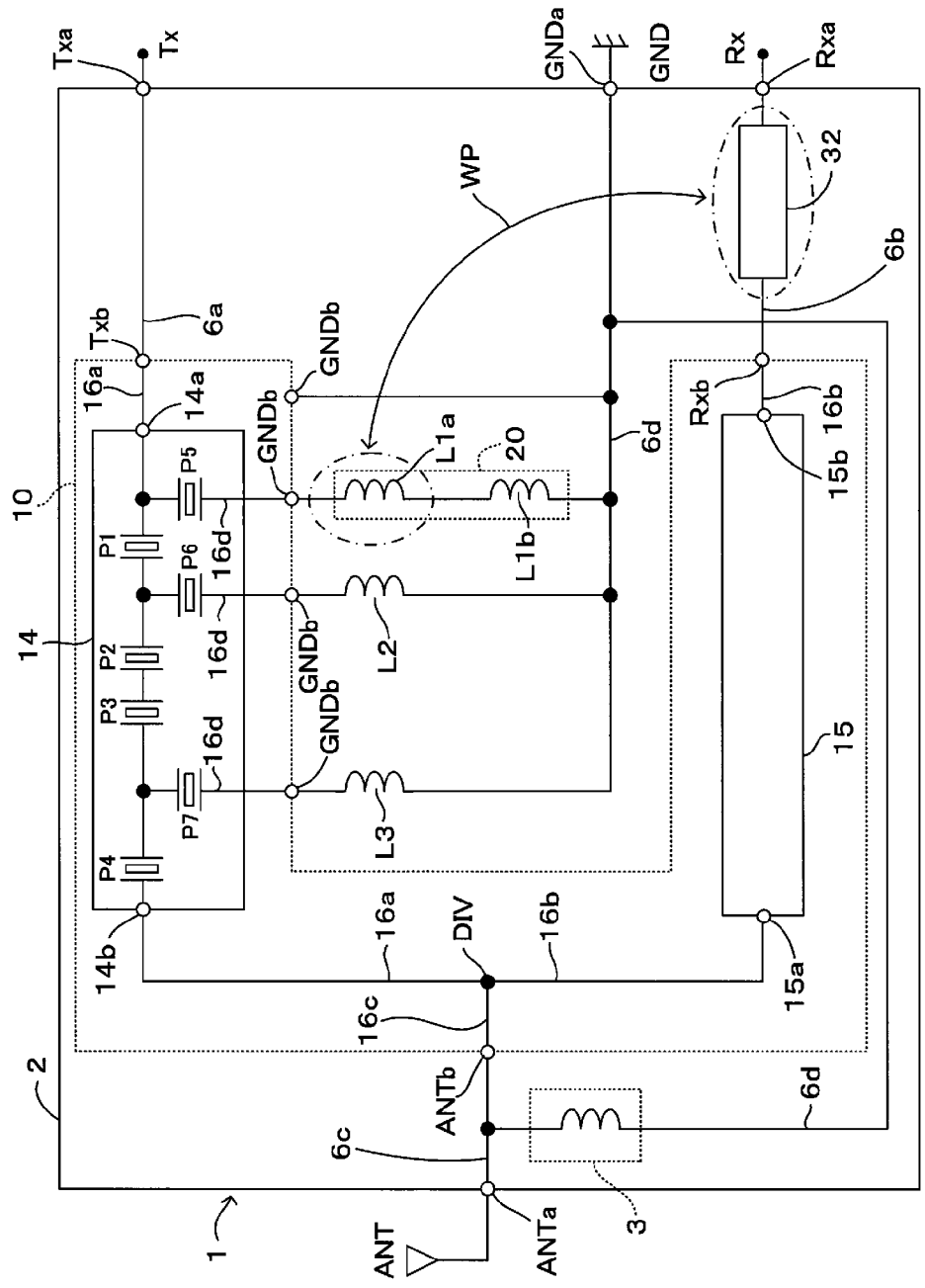
FIG. 10 is a circuit block diagram illustrating an electrical configuration of a radio frequency module according to a sixth preferred embodiment of the present invention.

This preferred embodiment is different from the first preferred embodiment in that, as illustrated in FIG. 10, a matching circuit 32 inserted in the substrate-side reception path 6b and the first inductor L1a are electromagnetically coupled to each other, such that the propagation path is provided between the substrate-side reception path 6b and the first inductor L1a. Even with such a configuration, the isolation characteristics and the attenuation characteristics of the radio frequency module 1 are effectively improved. The remaining configuration is similar to that in the first preferred embodiment, and thus, a description of the remaining configuration is omitted while the same reference signs as those in the first preferred embodiment are used.

Seventh Preferred Embodiment

A seventh preferred embodiment of the radio frequency module according to the present invention will be described below with reference to FIG. 11.

Figure 11:
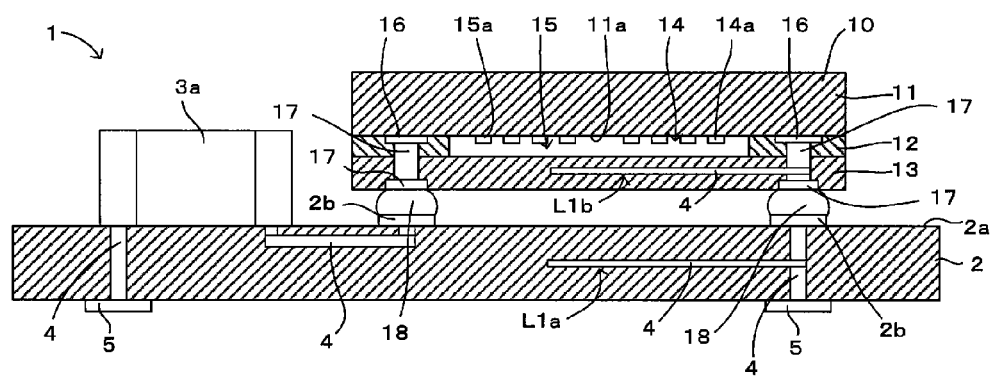
FIG. 11 is a sectional view illustrating a seventh preferred embodiment of the radio frequency module according to the present invention.
Figure 12:
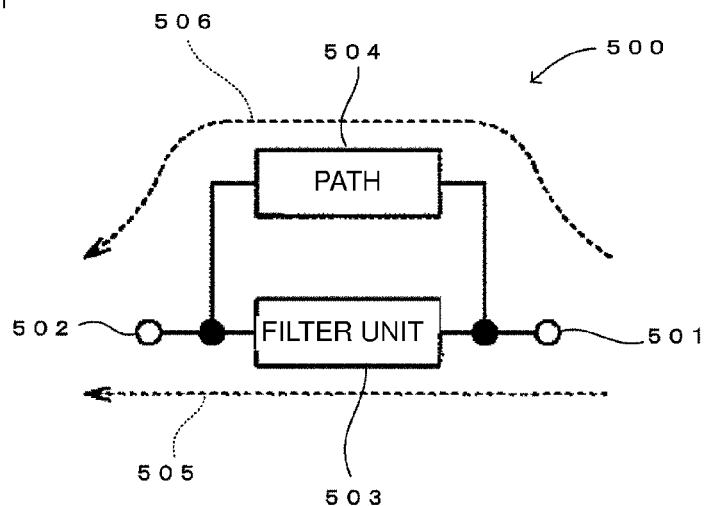
FIG. 12 illustrates a filter circuit included in a radio frequency module of the related art.

This preferred embodiment is different from the first preferred embodiment in that, as illustrated in FIG. 11, the second inductor L1b is defined by the wiring electrode 4 disposed in the cover layer 13 of the duplexer 10. With such a configuration, since the first and second inductors L1a and L1b are able to be arranged so as to be spaced apart by a larger distance, the first and second inductors L1a and L1b are able to be effectively suppressed or prevented from being electromagnetically coupled to each other, and the isolation characteristics and the attenuation characteristics of the radio frequency module 1 are effectively improved. In addition, since the second inductor L1b is located inside the duplexer 10, a space in the module substrate 2 where the second inductor L1b is to be located is no longer required, and size reduction of the radio frequency module 1 is achieved.

The present invention is not limited to the above-described preferred embodiments. Insofar as not departing from the gist of the present invention, various modifications other than the above-described ones can be made, and the components in the above-described preferred embodiments can be combined with each other in any suitable manner. The degree of the electromagnetic coupling that provides the propagation path WP is just required to be adjusted, for example, such that at least the phase characteristics of the RF signal outside the frequency band of the transmission signal passing through the propagation path WP are different from the phase characteristics of the RF signal outside the frequency band of the transmission signal passing through the transmission filter 14.

The ladder-type filter configuration of the transmission filter 14 is not limited to the above-described example, and the transmission filter 14 may be any suitable type insofar as the transmission filter 14 includes resonators that are connected in shunt for adjustment of the filter characteristics. The reception filter 15 may be defined by resonators utilizing elastic waves. Alternatively, the reception filter 15 may be defined by a general LC filter. The filter utilizing elastic waves is not limited to a SAW filter, and it may be defined by a BAW filter utilizing bulk acoustic waves.

The duplexer 10 is not limited to the above-described WLP structure, and it may have a CSP structure including a package board. Alternatively, the duplexer 10 of a bare chip structure may be directly mounted to the mounting surface 2a of the module substrate 2 without providing the above-described cover layer 13. When the duplexer 10 has the CSP structure including the package board, the second inductor L1b may be defined by a wiring electrode in/on the package board.

While the above preferred embodiments have been described, by way of example, in connection with the radio frequency module 1 including one duplexer 10 mounted on the module substrate 2, the radio frequency module may include two or more duplexers 10 mounted on the module substrate 2.

While, in the above preferred embodiments, the transmission filter 14 and the reception filter 15 are located in the same space, two separate spaces may be provided between the device substrate 11 and the cover layer 13 in a state surrounded by the support layer 12, and the transmission filter and the reception filter 15 may be located respectively in those two spaces. With such a configuration, the transmission filter 14 and the reception filter 15 are isolated from each other. Accordingly, heat generated, for example, during the application of electric power to the transmission filter 14 is able to be suppressed or prevented from affecting the characteristics of the reception filter 15, and the isolation characteristics between the transmission filter 14 and the reception filter 15 are able to be further improved.

The inductor circuit 20 may include an additional inductor, and the first and second inductors L1a and L1b may be connected to the transmission filter 14 in any order. Furthermore, the inductor circuit 20 may be connected to any of the parallel arm resonators P5 to P7. For example, when the inductor circuit 20 is connected to the parallel arm resonator P6, the inductor L2 may be connected to the parallel arm resonator P5. In another example, when the inductor circuit 20 is connected to the parallel arm resonator P7, the inductor L3 may be connected to the parallel arm resonator P5. As an alternative, the inductor circuit 20 may be connected to each of the plurality of parallel arm resonators. Respective inductances of the inductors L1a, L1b, L2 and L3 may each be set to an optimum value depending on the characteristics, such as resonant and anti-resonant frequencies and capacity, of the resonator to which the relevant inductance is connected.

The shape of the wiring electrode 4 defining each of the inductors L1a, L1b, L2 and L3 is not limited to any particular one, and the wiring electrode 4 may be appropriately configured in an optimum shape, such as a spiral type, a meander type, a helical type helically arranged in the layered direction of the module substrate 2, or a line type, for example. In consideration of the direction of magnetic flux in each of the above-mentioned types, the first and second inductors L1a and L1b defined by the wiring electrodes 4 may be located close to each other in a manner that does not cause electromagnetic coupling therebetween. When the first and second inductors L1a and L1b are both defined by the surface mounted components 7, the first and second inductors L1a and L1b may be positioned in consideration of the directions of respective magnetic fluxes of both of the inductors, such that those conductors are positioned close to each other in a manner that does not cause electromagnetic coupling therebetween. In a specific example, the first and second inductors L1a and L1b may be positioned such that the directions of respective magnetic fluxes of both of the conductors are perpendicular or substantially perpendicular to each other. In a more specific example, an inductor of the helical type and an inductor of the line type defined by a via conductor may be located inside the module substrate 2 in an overlapping relationship in the layered direction, but not electromagnetically coupled to each other.

Preferred embodiments of the present invention can be widely applied to radio frequency modules with the function of demultiplexing a transmission signal and a reception signal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio frequency module comprising:
  a transmission terminal to which a transmission signal is input;
  a transmission filter connected to the transmission terminal and including a ground terminal through which the transmission signal passes;
  a common terminal from which the transmission signal having passed through the transmission filter is output, and to which a reception signal is input;
  a reception filter which is connected to the common terminal, and through which the reception signal passes;
  a reception terminal from which the reception signal having passed through the reception filter is output;
  a branch point to which the common terminal, the transmission filter, and the reception filter are connected;
  a transmission path connecting the transmission terminal and the branch point;
  a reception path connecting the reception terminal and the branch point;
  a common path connecting the common terminal and the branch point;
  a matching circuit connected to the common path; and
  an inductor circuit including one end connected to the ground terminal and another end connected to a ground, the inductor circuit adjusting characteristics of the transmission filter; wherein
  the inductor circuit includes:
    a first inductor that defines a propagation path through electromagnetic coupling to at least one of the transmission path, the common path, the matching circuit, and the reception path; and a second inductor that is positioned so as not to be electromagnetically coupled to the transmission path, the common path, the matching circuit, or the reception path.

2. The radio frequency module according to claim 1, further comprising:

a module substrate including mounting electrodes to which the transmission terminal, the reception terminal, the common terminal, and the ground terminal are connected; wherein the matching circuit, the inductor circuit, and a ground electrode are electrically connected to the ground;

the transmission filter and the reception filter are mounted on the module substrate; and the ground electrode is located between the first inductor and the second inductor.

3. The radio frequency module according to claim 2, wherein the module substrate includes a multilayer substrate including a plurality of insulator layers that are laminated, and the first inductor and the second inductor are located inside the multilayer substrate so as to sandwich the ground electrode.

4. The radio frequency module according to claim 2, wherein one of the first inductor and the second inductor is defined by a chip surface mounted component and is mounted on the module substrate, and another one of the first inductor and the second inductor is defined by a wiring electrode that is disposed in the module substrate.

5. The radio frequency module according to claim 1, wherein the first inductor and the second inductor are positioned so as not to be overlapped with each other when viewed in a plan view.

6. The radio frequency module according to claim 1, wherein the transmission filter and the reception filter are integral with each other to define a duplexer, and the second inductor is located inside the duplexer.

7. The radio frequency module according to claim 6, wherein the duplexer has a wafer level package structure.

8. The radio frequency module according to claim 6, wherein the duplexer includes a device substrate, a support layer provided on the device substrate, and a cover layer provided on support layer such that a space is provided between the cover layer and the device substrate, the space being surrounded by the support layer; and the transmission filter and the reception filter are provided on the device substrate in the space.

9. The radio frequency module according to claim 8, wherein the support layer is made of one of a photosensitive epoxy resin and a polyimide resin.

10. The radio frequency module according to claim 8, wherein the cover layer is made of one of a photosensitive epoxy resin and a polyimide resin.

11. The radio frequency module according to claim 8, wherein the device substrate is a piezoelectric body, and the at least one of the transmission filter and the reception filter is defined by a surface acoustic wave filter.

12. The radio frequency module according to claim 11, wherein both of the transmission filter and the reception filter are defined by surface acoustic wave filters.

13. The radio frequency module according to claim 12, wherein the transmission filter includes a plurality of series arm resonators arranged in series in the transmission path and a plurality of parallel arm resonators respectively connected between connection junctions of the plurality of series arm resonators and the ground terminal.

14. The radio frequency module according to claim 12, wherein the reception filter includes a phase shifter resonator, and a longitudinally-coupled resonator defining a band pass filter connected in series to the phase shifter resonator.

15. The radio frequency module according to claim 1, wherein the matching circuit includes an inductor.

16. The radio frequency module according to claim 2, wherein the matching circuit includes an inductor defined by a chip surface mounted component that is mounted on the module substrate.

17. The radio frequency module according to claim 1, wherein the reception filter is a balanced filter.

18. The radio frequency module according to claim 1, wherein the matching circuit is defined by a first chip surface mounted component;

the first inductor is defined by a second chip surface mounted component; and the first and second chip surface mounted components are mounted adjacent to each other on the module substrate.

* * * * *